United States Patent [19]

Boemi

[11] Patent Number: 5,134,308

[45] Date of Patent: Jul. 28, 1992

[54] RISE AND FALL TIME SIGNAL PROCESSING SYSTEM

[75] Inventor: Lynn Boemi, Chandler, Ariz.

[73] Assignee: Medtronic, Inc., Minneapolis, Minn.

[21] Appl. No.: 819,619

[22] Filed: Jan. 9, 1992

Related U.S. Application Data

[63] Continuation of Ser. No. 447,739, Dec. 8, 1989, abandoned.

[51] Int. Cl.[5] ........................... H03K 5/08; H03K 5/12
[52] U.S. Cl. ..................................... 307/263; 307/228;
  307/261; 307/268; 328/181; 328/185
[58] Field of Search ............... 307/263, 246, 228, 265,
  307/261, 268, 270; 328/127, 114, 181, 185

[56] References Cited

U.S. PATENT DOCUMENTS

| | | | |
|---|---|---|---|
| 3,839,679 | 10/1974 | Hughes | 307/246 |
| 4,016,498 | 4/1977 | Hadley | 307/228 |
| 4,138,612 | 2/1979 | Schlesinger | 307/566 |
| 4,228,366 | 10/1980 | Hüttemann et al. | 307/228 |
| 4,449,059 | 5/1984 | Dickes | 307/263 |
| 4,728,813 | 3/1988 | Diller | 307/228 |
| 4,908,526 | 3/1990 | Mefford | 307/263 |

Primary Examiner—Timothy P. Callahan
Attorney, Agent, or Firm—John A. Rissman; Harold R. Patton

[57] ABSTRACT

A monolitic rise and fall time generator system utilizing a trimmable bias resistor connected to a current generator. The trimmable resistor permits the rise and fall time to be trimmed to any value. A switch is connected between a current source and a current sink. A level shifter connects to the switch and receives a data input signal. A ramped voltage output signal is generated at the common node of the current source and the switch through a capacitive load and a voltage clamp.

8 Claims, 4 Drawing Sheets

RISE AND FALL TIME SIGNAL PROCESSING SYSTEM

CROSS REFERENCE TO CO-PENDING APPLICATIONS

This is a continuation of U.S. application Ser. No. 07/447,739, filed on Dec. 8, 1989, now abandoned.

BACKGROUND OF THE INVENTION

1. Field of the Invention

The present invention pertains to a monolithic trimmable rise and fall time generator.

2. Description of the Prior Art

To reduce the high frequency harmonic content of a transmitted signal, Mil-Std-1553 requires the output waveform to have a rise and fall time between 100 nano-sec and 300 nano-sec. This then decreases signal coupling onto adjacent cables. There is also a further requirement from some users of Mil-Std-1553, for the rise and fall time to be between 240 nano-sec and 300 nano-sec.

To produce these results, the standard approach has been to use a resistor/capacitor filter which required tight tolerance components, and therefore, necessitated a hybrid solution. The IC circuit of the present invention provides the same results with the elimination of discrete hybrid components.

Transceiver manufacturers include Data Device Corporation, and Marconi, all of which use hybrid solutions that consist of a resistor/capacitor. This technique does provide a stable rise and fall time, but to stay within the specified limits of 1553, the resistor/capacitor components must have a tight tolerance of $+/-2\%$. This would be impractical on an integrated circuit where the components may vary as much as $+/-20\%$.

The present invention provides a circuit which allows the rise and fall time to be trimmed to any value. A preferred operational parameter is to be in the middle of each specification (i.e., 200 ns for 1553). The trimming can be done by laser cutting a thin film resistor or selecting a different discrete resistor value on the monolith.

SUMMARY OF THE INVENTION

The general purpose of the present invention is a rise and fall time generator system with a rise and fall time between 100 nanoseconds and 300 nanoseconds utilizing a monolithic trimmable resistor.

According to one embodiment of a rise and fall time generator system, the present invention, there is provided a trimmable resistor which connects to a current generator and which can be laser cut thin film resistor or a selected discrete resistor value in the monolith. The electrical circuit for the rise and fall time generator system includes a level shifter with a data input connected to a switch, a current generator including a suitable trim resistor connected to a first current source I and a second current sink 2I, Where both current sinks connect to the switch. A capacitive load and voltage clamp connect to a node between the first current source and the switch.

Significant aspects and features of the present invention includes a trimmable rise and fall generator system which can also be used as a filter and which includes: a) output is a voltage source $(+/-7$ v $+/-5\%)$; b) rise and fall times are within $+2/-10\%$; c) rise and fall times ar trimmable; d) the circuit is self-contained on one die—Rtrim can be made from CrSi links to be laser cut; e) output is frequency limited by Rtrim; f) input is TTL; and g) propagation delay time is $<20$ ns.

Another significant aspect and feature of the present invention is a fast, TTL non-saturating comparator with a delay time $<30$ ns; TTl outputs; $VOL<100$ mV from $-55°$ C. to $+125°$ C.; variable supply voltages with no output distortion from $VEE=-12$ to $-15$ v and $VCC=+12$ v to $+15$ v; no saturating transistors; and lower cost by using a standard process.

A further significant aspect and feature of the present invention is a high drive inhibiting bipolar output driver where the output V follows input V. The circuit is capable of driving a 50 ohm load at 20 MHz with a large signal. The 20 maximum current output is 150 mA. There is a low output "on" impedance $<5$ ohm. There is a high output "off" impedance, $R=$infinite, $C<5$ pf. The delay from on to off time is about 2.5 usec. The delay from off to on time $<200$ ns.

Still another significant aspect and feature is the ability to be completely integrated. Along with integration comes the following: more reliable, takes less space, costs less, and versatile for different customer requirements. Also, the inventory management is one device which can now do the job of many devices.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DESCRIPTION OF THE PREFERRED EMBODIMENTS

Figure 1:
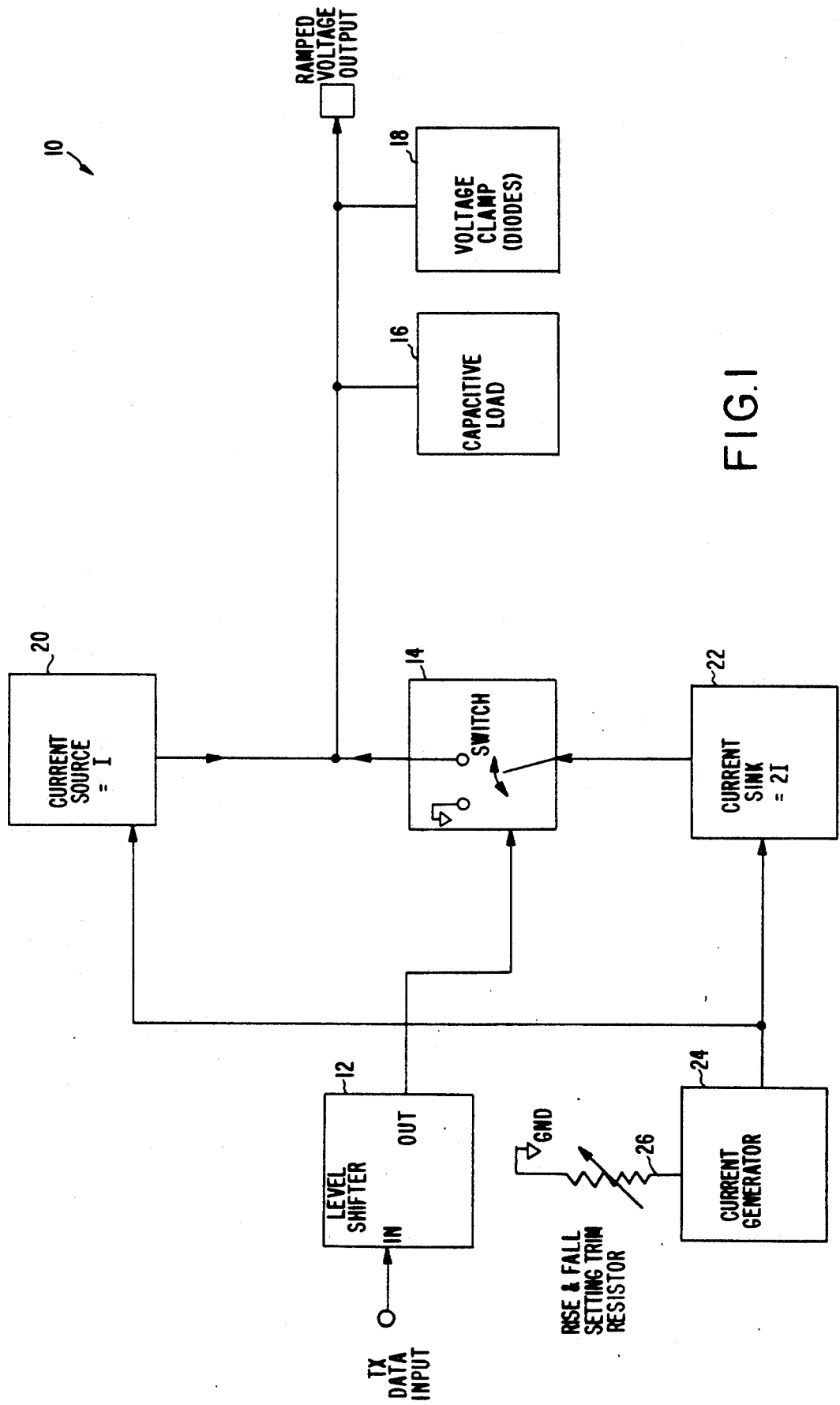
FIG. 1 illustrates a block diagram of a rise and fall time generator system.

FIG. illustrates a block diagram 10 of a rise and fall time generator system, the present invention, including a data signal input to a level shifter 12 which connects to a transistor switch 14 with a capacitive load 16 and a voltage clamp 18. A current source 20 and a current sink 22 connect between a current generator 24 and the switch 14. In the preferred mode, a single rise and fall setting trim resistor 26 connects between the current generator and ground. This trimmable resistor can be a monolithic trimmable resistor or a plurality of trimmable resistors on the monolithic.

Figure 2:
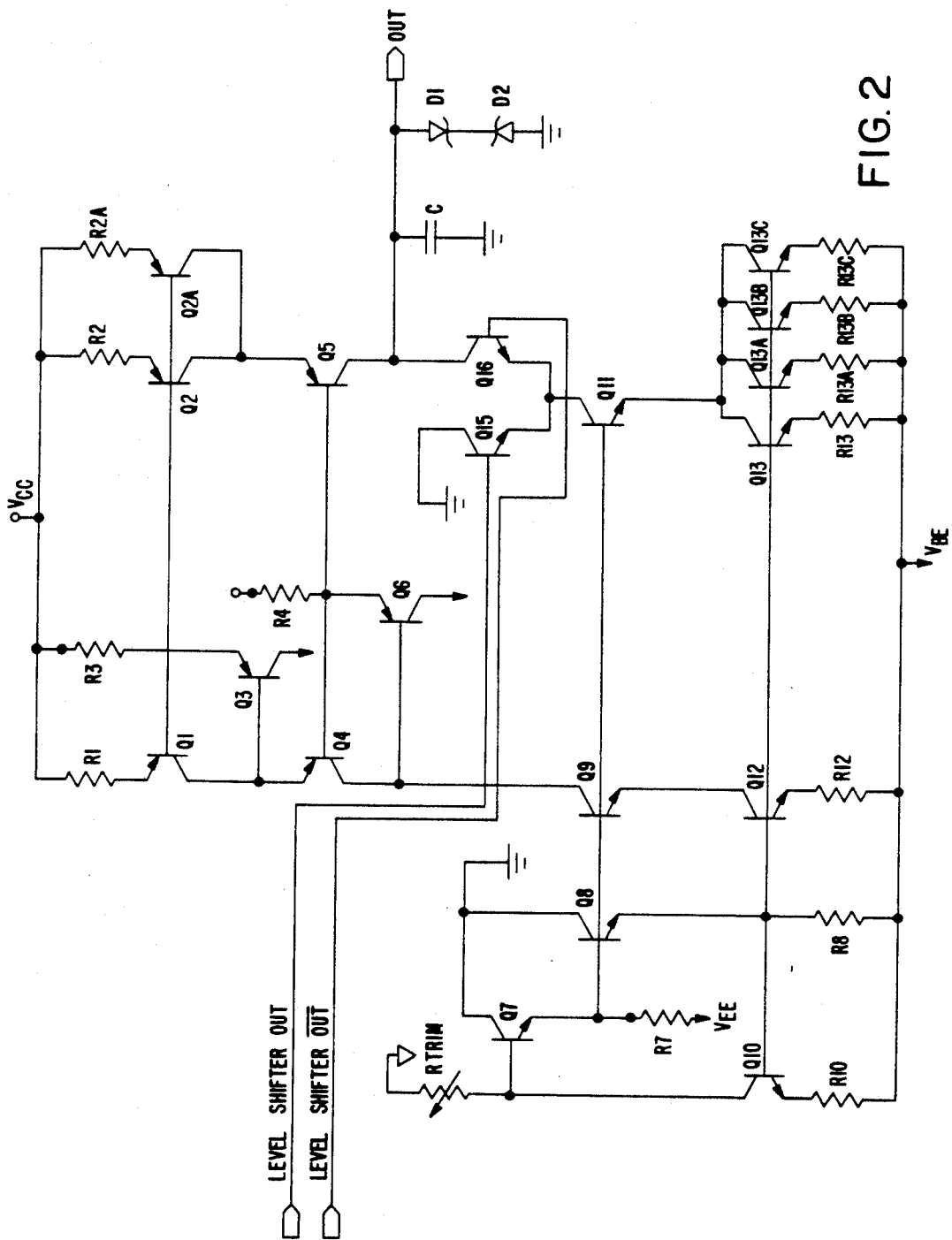
FIG. 2 illustrates an electrical circuit schematic diagram for the rise and fall time generator system.

FIG. 2 illustrates an electrical circuit schematic diagram of the rise and fall time generator system including two switching transistors Q15 and Q16 which connect to a positive and the inverse level shifter signals. The output signal connects to the collector of Q16 with an integrating capacitor C and clamp diodes D1 and D2. Transistors Q1-Q6 and resistors R1-R4 comprise a first cascode current source. Transistors Q7-Q13 and resistors R7-R13 comprise a second cascode current source.

Specifically, resistors R1, R2 and R2A are emitter degeneration resistors which off load dependency on Vbe tracking and tie the emitters through the resistors in a current mirror configuration. Resistor R3 is a bias resistor for Q3. Resistor R4 is a bias resistor for transistor Q6. Transistors Q1–Q6 are PNP transistors. Transistor Q1 biases transistors Q2 and Q2A which determine the reference current signal level at the output of the capacitor C. Transistors Q3 and Q6 are bias transistors which also decrease and deemphasize the effects of transistor beta. Transistors Q4 and Q5 are cascode transistors for early voltage protection providing a stiffer current source. Transistors Q7–Q13 are NPN transistors. Transistors Q9 and Q11 are cascode transistors, like Q4 and Q5. Transistors Q7 and Q8 are bias transistors like Q3 and Q6. Q10 sets the current in transistors Q12 and Q13–Q13c, as determined by the bias resistor RTRIM. Transistor Q10 biases transistors Q13–13c which set the current level at the capacitor C. Resistors R10, R12 and R13a-R13c are degeneration resistors.

MODE OF OPERATION

RTRIM sets up a bias current in Q10 equal to: I Bias=Vee−3 Vbe/RTRIM. The current is mirrored by Q12 and Q13–13c. The current is Q12 gets pulled from Q1 which is mirrored by Q2 and Q2A. Transistors Q7 through Q13 form a cascoded current source which at Q11's collector is equal to four times the bias current in Q10. Transistors Q1 through Q5 form another cascoded current source which at Q5's collector is equal to twice the bias current in Q10. Transistors Q15 and Q16 form a switch which steers the current of Q11 to the output or ground depending on the voltage conditions at the bases of Q15 and Q16. These base voltages are derived from a TTL signal supplied by the system and buffered by a level shifter circuit which allow Q15 and Q16 to switch completely. Since transistor Q5 is always sending current to the output, the switching of Q11 current through Q15 to ground will result in a total output current equal to a positive (sourcing) value equal to twice the bias current (i.e., Iout= +2IBias, but when the current of Q11 is sent through Q16 to the output, the total output current becomes a negative (sinking) value equal to twice the bias current (i.e., Iout=2IBias−4 IBias=−2IBias). This sourcing and sinking the same amount of current to the output load which is a capacitor produces a ramped voltage governed by:

$$I_{out} = C_L \frac{\Delta Vout}{\Delta t}, \text{ or } \Delta t = C_L \frac{\Delta Vout}{Iout}$$

where Δt=Rise and Fall Time.

As the current is increased, the rise and fall times will decrease and vice versa. The diodes D1 and D2 form a clamp which turns on when the output voltage equals +/−7 volts. This clamp keeps the voltage from getting too high, positive, or negative, and saturating Q5 or Q16, respectively. The ramped voltage is then buffered by a current gain stage and used to drive a MIL-STD-1553 bus.

Figure 3:
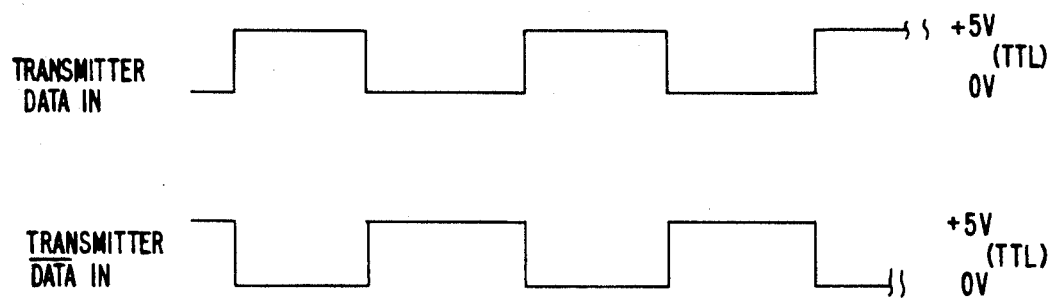
FIG. 3 illustrates representative data input signal.

FIG. 3 illustrates a representative data input signal with respect to time of an on-off signal of between 0 and +5 volts. In the preferred embodiment, the input circuitry is standard TTL logic for which VOL<0.5 volts and VOH>2.0 volts.

Figure 4:
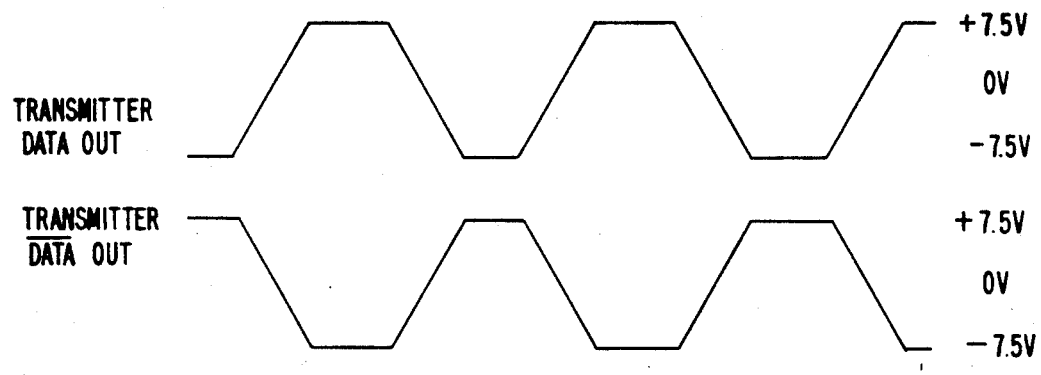
FIG. 4 illustrates representative output signals.

FIG. 4 illustrates representative ramped voltage output signals with respect to time of +7.0 volts to −7.0 volts. This signal falls within the rise time requirements of Mil-Std-1553.

Figure 5:
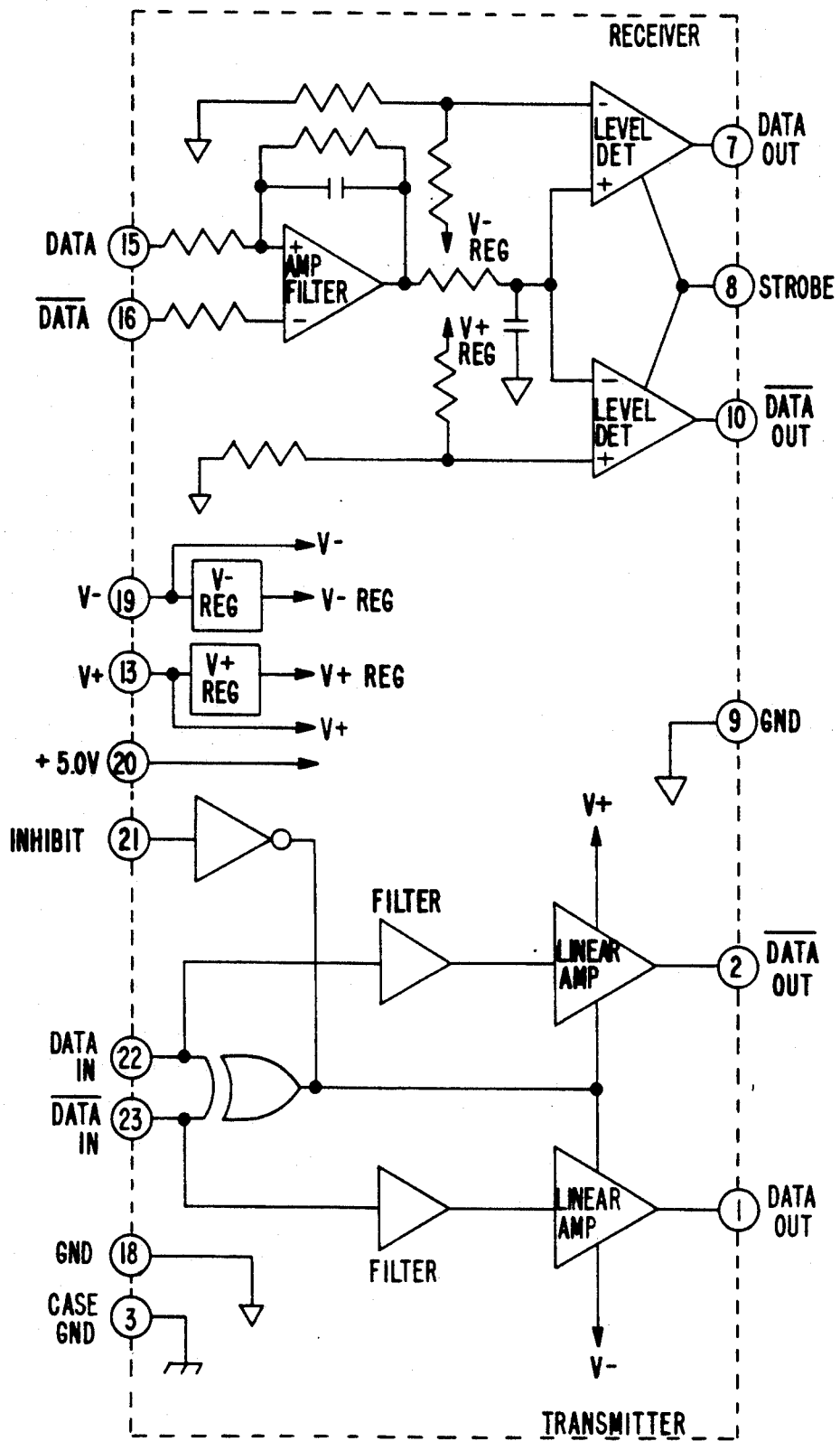
FIG. 5 illustrates a representative electrical circuit block diagram utilizing the rise and fall time generator system.

FIG. 5 illustrates an electrical circuit block diagram of a representative transceiver which utilizes the rise and fall time generator system denoted in the block diagram as a filter. The electrical schematic and specification of the transceiver are in a drawing and data sheet incorporated herein by reference to Appendix q. The transmitter circuit accepts complementary TTL signals and produces a peak-to-peak differential signal output. The transmitter processes the digital signal to provide a rise time that is predetermined by the user. The rise and fall time generator system is utilized as a filter in the example which is for purposes of illustration and not to be construed as limiting of the present invention.

Various modifications can be made to the present invention without departing from the apparent scope hereof.

We claim:

1. A monolithic data communication signal processing system for converting a substantially binary data communication input signal into an output signal representative of said input signal, said output signal varying between a predetermined minimum value and a predetermined maximum value and further having a predetermined rise time and fall time, said signal processing system comprising:
    (a) bias current adjustment means for setting a bias current having a predetermined, permanent level for said signal processing system;
    (b) first current mirror means connected to said bias current adjustment means for providing a source current, said source current having a level which varies as a function of said predetermined bias current level setting;
    (c) second current mirror means connected to said bias current adjustment means for providing a sink current, said sink current having a level which varies as a function of said predetermined bias current level setting;
    (d) switching means connected to said first current mirror means and said second current mirror means and further being responsively coupled to said input signal, said switching means functioning between a first switch state and a second switch state for switchably directing the flow of said source current and said sink current as a function of changes in said input signal;
    (e) output means coupled to said switching means for providing said converted output signal, said output means comprising a capacitive load and a voltage clamp connected to said capacitive load for limiting the minimum and maximum values of said converted output signal;
    (f) said switching means being responsive to changes in said input signal between a first binary state and a second binary state, such that:
        (1) in response to a change in said input signal from said first binary state to said second binary state, said switching means directs the flow of said source current to said load for charging said load to said predetermined maximum output value, thereby defining said predetermined rise time; and
        (2) in response to a change in said input signal from said second binary state to said first binary state, said switching means directs the flow of said source current to said second current mirror means, and further couples said load to said sink current, for discharging said load from said predetermined maximum output value to said predetermined minimum output value, thereby defining said predetermined fall time.

2. The signal processing system of claim 1, wherein said bias current adjustment means includes a trimmable, integrated resistor.

3. The signal processing system of claim 1, wherein said sink current level comprises a predetermined multiple of said source current level.

4. The signal processing system of claim 1, wherein said predetermined rise time and fall time are of substantially equal duration.

5. A method for converting a substantially binary data communication input signal into an output signal representative of said input signal, said output signal varying between a predetermined minimum value and a predetermined maximum value and further having a predetermined rise time and fall time, said method comprising the steps of:

(a) permanently establishing a bias current to a desired level;

(b) providing a source current having a level which is a first predetermined multiple of said bias current level;

(c) providing a sink current having a level which is a second predetermined multiple of said bias current level;

(d) directing said source current to an output circuit, in response to a change in said input signal from a first binary state to a second binary state, and integrating said source current in a capacitive load within said output circuit for a predetermined rise time and to a predetermined maximum output value; and (e) redirecting said source current to said sink current, and further coupling said sink current to said capacitive load, in response to a change in said input signal from a second binary state to a first binary state, and discharging said load for a predetermined fall time and to a predetermined minimum output value.

6. The method of claim 5, wherein the step 17(a) of permanently establishing the bias current to a desired level comprises the step of laser trimming a resistor.

7. The method of claim 5, wherein:

(a) the step of 17(b) of providing a source current level having a first predetermined multiple of said bias current level comprises the step of cascoding said bias current in a first cascoded current mirror; and (b) the step of 17(c) of providing a sink current level having a second predetermined multiple of said bias current level comprises the step of cascoding said bias current in a second cascoded current mirror.

8. The method of claim 5, wherein the step of 17(c) further comprises establishing said sink current level to be a multiple of approximately twice that of said source current level.

* * * * *